(12) United States Patent
Hata et al.

(10) Patent No.: US 7,952,872 B1
(45) Date of Patent: May 31, 2011

(54) COOLING DEVICE AND ELECTRONIC APPARATUS

(75) Inventors: Yukihiko Hata, Hamura (JP); Shinji Hiratomo, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/873,894

(22) Filed: Sep. 1, 2010

(30) Foreign Application Priority Data

Dec. 25, 2009  (JP) ................................. 2009-296328

(51) Int. Cl.
 *H05K 7/20* (2006.01)
(52) U.S. Cl. ........ 361/697; 361/709; 361/710; 361/695; 361/679.48; 361/679.54
(58) Field of Classification Search .................. 361/695, 361/697, 709, 710, 679.48, 679.54
 See application file for complete search history.

(56) References Cited

U.S. PATENT DOCUMENTS

| | | | | |
|---|---|---|---|---|
| 5,353,863 | A * | 10/1994 | Yu ................................. | 165/80.3 |
| 5,452,181 | A | 9/1995 | Hoover | |
| 5,630,469 | A * | 5/1997 | Butterbaugh et al. ....... | 165/80.3 |
| 6,301,901 | B1 | 10/2001 | Coffee et al. .................... | 62/3.7 |
| 6,304,445 | B1 * | 10/2001 | Bollesen ........................ | 361/697 |
| 6,311,767 | B1 | 11/2001 | Inoue et al. | |
| 6,496,368 | B2 * | 12/2002 | Jui-Yuan ....................... | 361/697 |
| 6,542,364 | B2 * | 4/2003 | Lai et al. ........................ | 361/697 |
| 6,711,016 | B2 * | 3/2004 | Chung et al. .................. | 361/695 |
| 6,768,641 | B2 * | 7/2004 | Li ................................. | 361/719 |
| 6,779,595 | B1 * | 8/2004 | Chiang .................... | 165/104.33 |
| 6,894,898 | B2 * | 5/2005 | Liu ................................. | 361/697 |
| 6,938,682 | B2 * | 9/2005 | Chen et al. ............... | 165/104.33 |
| 6,950,306 | B2 * | 9/2005 | Huang et al. ................... | 361/697 |
| 6,958,915 | B2 * | 10/2005 | Wang et al. .................... | 361/709 |
| 6,967,845 | B2 * | 11/2005 | Chiang et al. ................. | 361/709 |
| 7,040,384 | B2 * | 5/2006 | Shiang-Chich ............... | 165/122 |
| 7,073,568 | B2 * | 7/2006 | Chen et al. ............... | 165/104.33 |
| 7,123,483 | B2 * | 10/2006 | Otsuki et al. ................... | 361/710 |
| 7,130,192 | B2 * | 10/2006 | Wang et al. .................... | 361/697 |

(Continued)

FOREIGN PATENT DOCUMENTS

JP 10-500251 1/1998

(Continued)

OTHER PUBLICATIONS

Notice of Reasons for Rejection mailed by Japan Patent Office on Dec. 14, 2010 in a corresponding Japanese patent application No. 2010-249841.

*Primary Examiner* — Anatoly Vortman
(74) *Attorney, Agent, or Firm* — Knobbe, Martens, Olson & Bear LLP

(57) ABSTRACT

According to one embodiment, a cooling device includes a cooling fan, a heat sink, an inserting portion, a projection, and a holder. The inserting portion is provided on one of the cooling fan and the heat sink. The projection is provided on the inserting portion, and protrudes in a direction intersecting an inserting direction of the inserting portion. The holder is provided on the other one of the cooling fan and the heat sink, and configured to receive the inserting portion. The holder includes (i) an opening portion configured to engage with the projection, (ii) a first supporter facing the inserting portion in a first direction intersecting the inserting direction of the inserting portion and a protruding direction of the projection, and (iii) a second supporter facing the inserting portion in a second direction different from the first direction.

10 Claims, 8 Drawing Sheets

U.S. PATENT DOCUMENTS

| | | | | |
|---|---|---|---|---|
| 7,133,288 | B2 * | 11/2006 | DelPrete et al. | 361/719 |
| 7,333,332 | B2 * | 2/2008 | Wang | 361/700 |
| 7,414,850 | B2 * | 8/2008 | Hung | 361/719 |
| 7,447,020 | B2 * | 11/2008 | Xia et al. | 361/695 |
| 7,460,370 | B2 * | 12/2008 | Cheng et al. | 361/700 |
| 7,742,295 | B2 * | 6/2010 | Hata et al. | 361/679.47 |
| 2002/0043360 | A1 * | 4/2002 | Lee | 165/80.3 |
| 2003/0202327 | A1 * | 10/2003 | Chung et al. | 361/697 |
| 2004/0066628 | A1 * | 4/2004 | Liu | 361/704 |
| 2004/0174675 | A1 * | 9/2004 | Liu | 361/687 |
| 2005/0073811 | A1 * | 4/2005 | Wang et al. | 361/688 |
| 2005/0087329 | A1 * | 4/2005 | Zhang et al. | 165/104.33 |
| 2007/0121291 | A1 * | 5/2007 | Wang et al. | 361/695 |
| 2007/0251675 | A1 * | 11/2007 | Hwang et al. | 165/104.33 |

FOREIGN PATENT DOCUMENTS

| | | |
|---|---|---|
| JP | 2002-280499 A | 9/2002 |
| JP | 3099291 U | 4/2004 |
| JP | U 3116438 | 10/2005 |
| JP | 2008-250616 A | 10/2008 |
| WO | WO 95/21518 | 8/1995 |

* cited by examiner

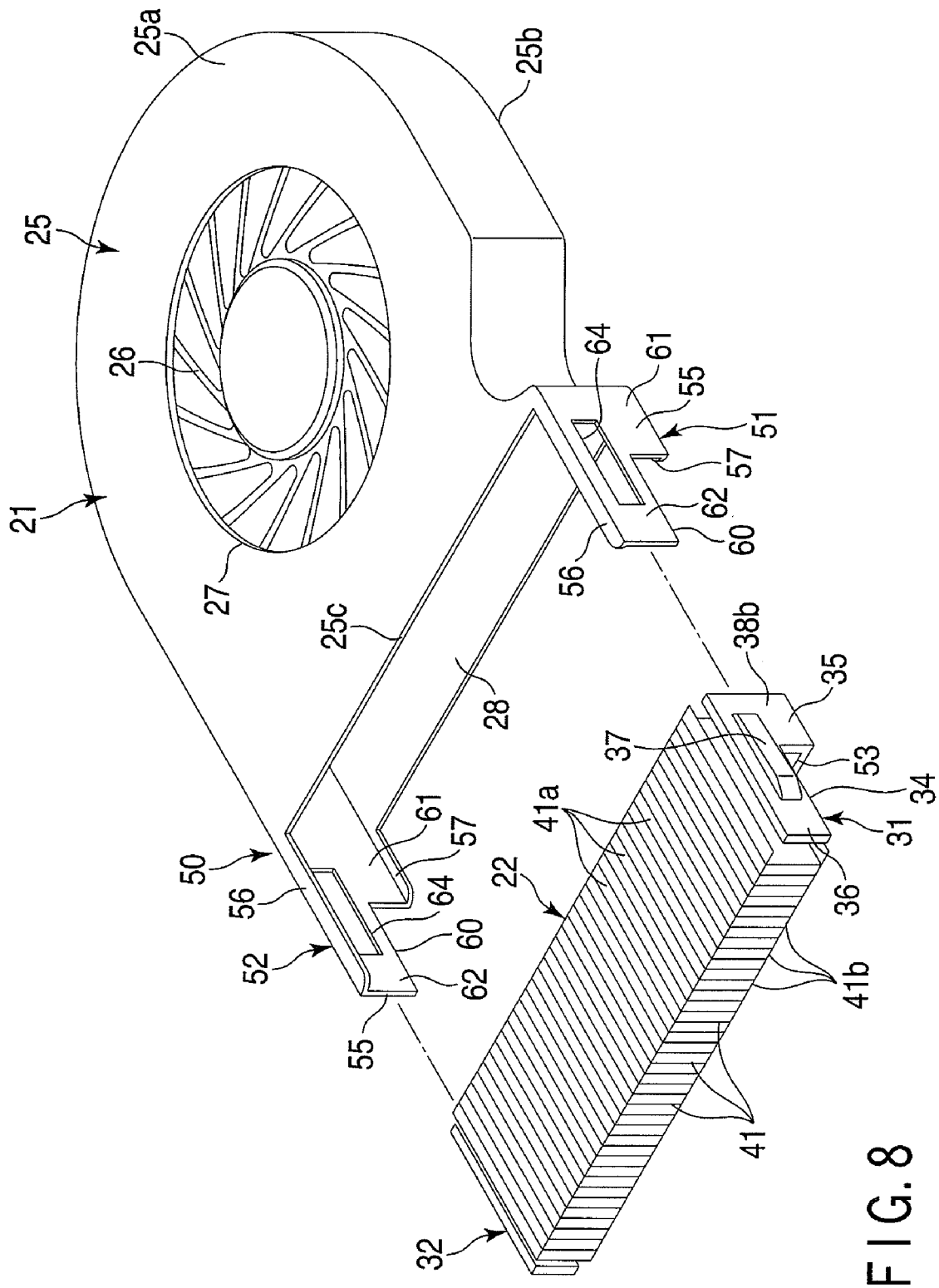
F I G. 8

COOLING DEVICE AND ELECTRONIC APPARATUS

CROSS-REFERENCE TO RELATED APPLICATIONS

This application is based upon and claims the benefit of priority from Japanese Patent Application No. 2009-296328, filed Dec. 25, 2009; the entire contents of which are incorporated herein by reference.

FIELD

Embodiments described herein relate generally to a cooling device including a cooling fan and a heat sink and an electronic apparatus including the same.

BACKGROUND

Electronic apparatuses, such as notebook PCs, comprise a cooling device including a cooling fan and a heat sink. Japanese Utility Model Registration No. 3116438 discloses a structure in which a cooling fan is provided between a pair of radiation fin sets. A base is closely attached to the upper surface of a heating component. A heat conductive pipe is fixed to the base. The heat conductive pipe includes a cylindrical portion that passes through the radiation fin sets. The cooling fan includes a through hole to which the cylindrical portion is fitted.

BRIEF DESCRIPTION OF THE DRAWINGS

A general architecture that implements the various feature of the embodiments will now be described with reference to the drawings. The drawings and the associated descriptions are provided to illustrate embodiments and not to limit the scope of the invention.

FIG. 8 is an exemplary perspective view illustrating a cooling device according to a second embodiment;

DETAILED DESCRIPTION

Various embodiments will be described hereinafter with reference to the accompanying drawings. In general, according to one embodiment, a cooling device comprises a cooling fan, a heat sink, an inserting portion, a projection, and a holder. The inserting portion is provided on one of the cooling fan and the heat sink. The projection is provided on the inserting portion, and protrudes in a direction intersecting an inserting direction of the inserting portion. The holder is provided on the other one of the cooling fan and the heat sink, and configured to receive the inserting portion. The holder comprises (i) an opening portion configured to engage with the projection, (ii) a first supporter facing the inserting portion in a first direction intersecting the inserting direction of the inserting portion and a protruding direction of the projection, and (iii) a second supporter facing the inserting portion in a second direction different from the first direction.

Hereinafter, exemplary embodiments applied to a notebook personal computer (hereinafter, referred to as a notebook PC) will be described with reference to the accompanying drawings.

First Embodiment

FIGS. 1 to 7 show an electronic apparatus 1 according to a first embodiment. The electronic apparatus 1 is, for example, a notebook PC. However, electronic apparatuses to which the embodiment can be applied are not limited thereto. The embodiment can be widely applied to various kinds of electronic apparatuses including a display apparatus, such as a television, a personal digital assistant (PDA), and a game device.

Figure 1:
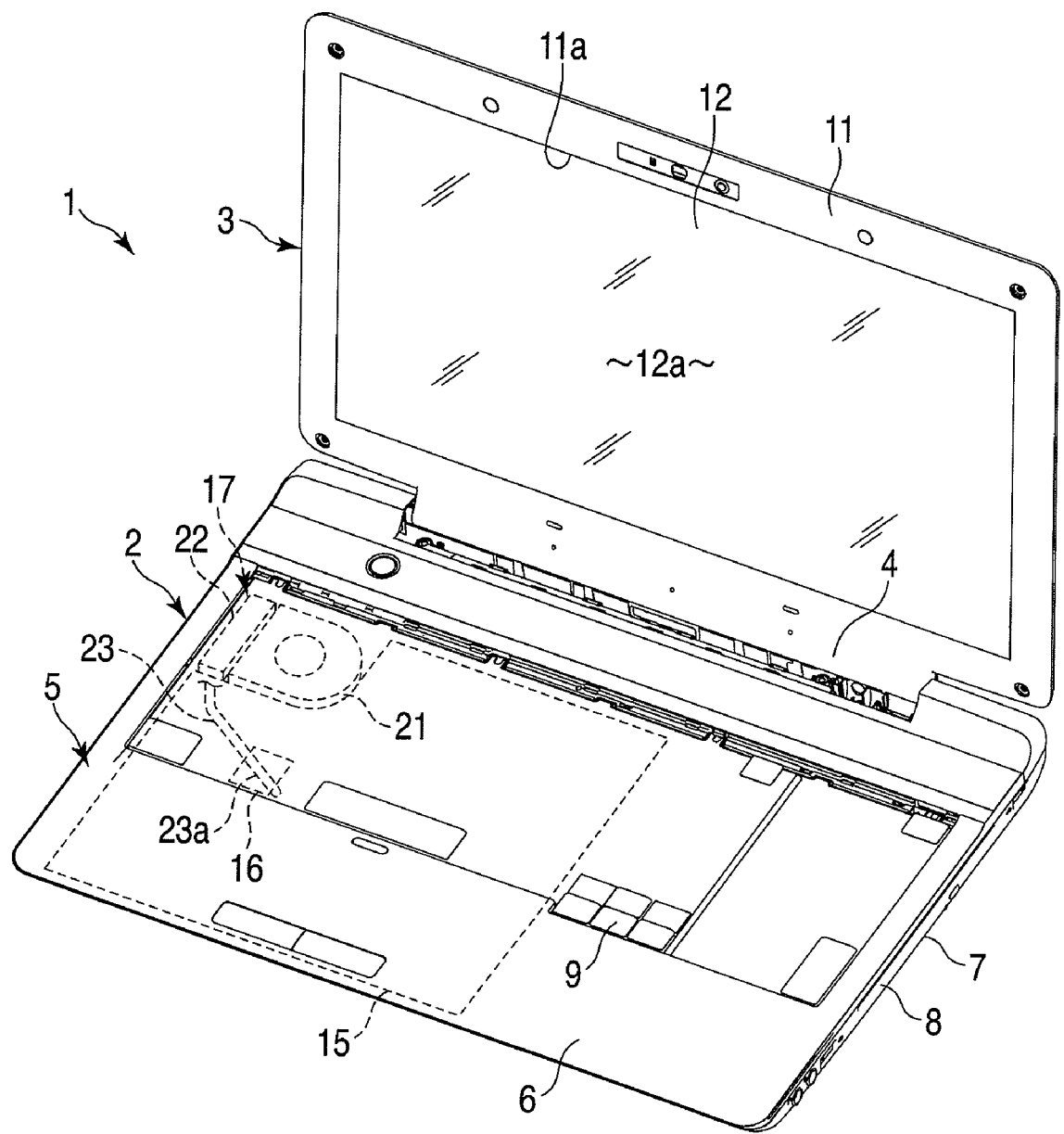
FIG. 1 is an exemplary perspective view illustrating an electronic apparatus according to a first embodiment.

As shown in FIG. 1, the electronic apparatus 1 comprises a main unit 2, a display unit 3, and a hinge 4. The main unit 2 is an electronic apparatus main body provided with a main circuit board. The main unit 2 includes a housing 5. The housing 5 has a flat box shape including an upper wall 6, a lower wall 7, and a circumferential wall 8.

The lower wall 7 faces a desk surface when the electronic apparatus 1 is placed on a desk. The lower wall 7 is substantially parallel to the desk surface. The upper wall 6 is opposite to the lower wall 7 with a space therebetween and extends substantially in parallel (that is, substantially in a horizontal direction) to the lower wall 7. A keyboard 9 is provided on the upper wall 6. In FIG. 1, only some keys of the keyboard 9 are shown. The circumferential wall 8 rises with respect to the lower wall 7, and connects the edge portion of the lower wall 7 and the edge portion of the upper wall 6.

As shown in FIG. 1, the display unit 3 is rotatably (openably) connected to the rear end portion of the main unit 2 by, for example, the hinge 4. The display unit 3 comprises a display housing 11 and a display device 12 in the display housing 11. The display housing 11 includes a relatively large opening portion 11a through which a display screen 12a of the display device 12 is exposed to the outside. The display unit 3 can be pivoted between a closed position where the display unit 3 falls and covers the main unit 2 from the upper side and an opened position where the display unit 3 rises with respect to the main unit 2.

As shown in FIG. 1, a circuit board 15, a heating component 16, and a cooling device 17 are contained in the housing 5. The cooling device 17 includes a cooling fan 21, a heat sink 22, and a heat pipe 23. The circuit board 15 is disposed in the housing 5 substantially in a horizontal direction. The circuit board 15 is, for example, a main board.

The heating component 16 is mounted on the circuit board 15. The heating component 16 is an electronic component that emits heat in use and is, for example, a CPU. The heating component 16 is not limited to the CPU, but any kind of components requiring heat dissipation, such as a graphic chip, North Bridge (trademark) and a memory, may be used as the heating component.

Figure 2:
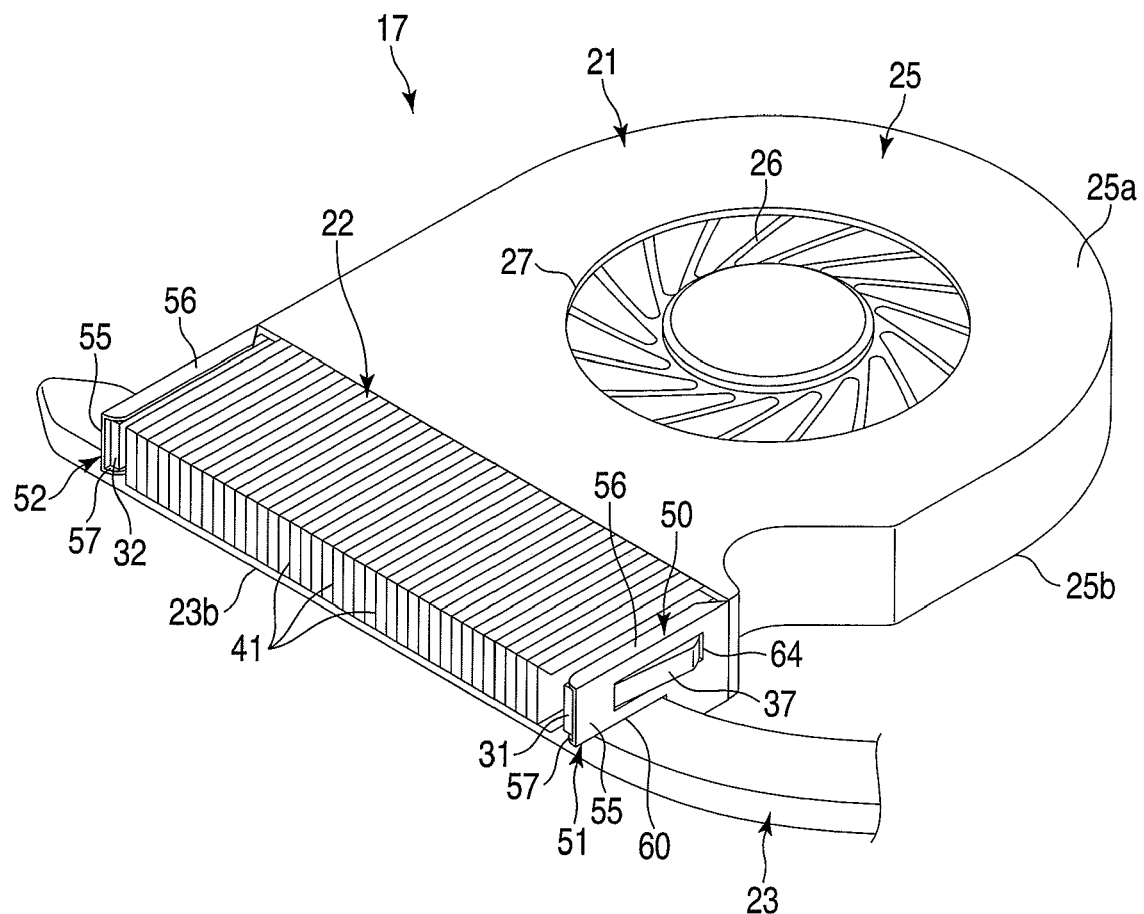
FIG. 2 is an exemplary perspective view illustrating a cooling device according to a first embodiment.
Figure 3:
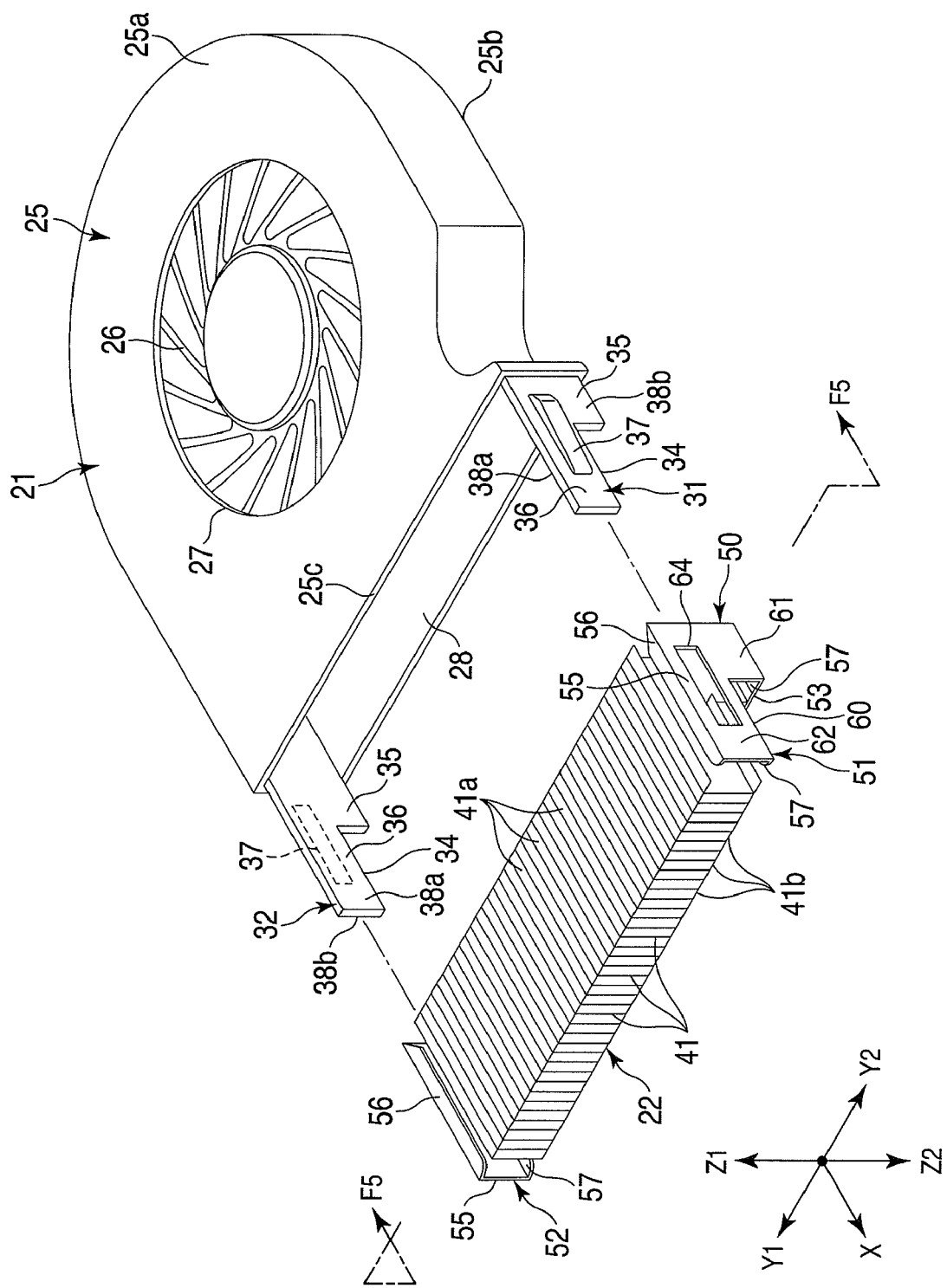
FIG. 3 is an exemplary exploded perspective view illustrating the cooling device shown in FIG. 2.

The cooling fan 21 and the heat sink 22 are close to the circumferential wall 8 in the housing 5. The cooling fan 21 is, for example, a centrifugal cooling fan. As shown in FIGS. 2 and 3, the cooling fan 21 comprises a fan case 25 and an impeller 26.

The fan case 25 has a flat box shape. The fan case 25 includes an upper surface 25a, a lower surface 25b, and a side surface 25c. The fan case 25 further includes air intakes 27 in the upper surface 25a and the lower surface 25b, and a discharge hole 28 (i.e., outlet) in the side surface 25c. The fan case 25 is made of, for example, a synthetic resin. The impeller 26 is in the fan case 25 and can be rotated. The impeller 26 of the cooling fan 21 is rotated to draw air in the housing 5 through the air intakes 27 and discharge the drawn air to the heat sink 22 through the discharge hole 28. In this way, the cooling fan 21 cools the heat sink 22.

The cooling fan 21 includes a pair of inserting portions 31 and 32 (first and second inserting portions 31 and 32). The inserting portions 31 and 32 are engaging portions inserted into and engaged with holders 51 and 52, which will be described below. The first and second inserting portions 31 and 32 protrude from the fan case 25 in a direction in which air is discharged from the cooling fan 21 (in FIG. 3, the X direction), that is, in a direction from the cooling fan 21 to the heat sink 22.

The first and second inserting portions 31 and 32 are on both sides of the discharge hole 28. Each of the first and second inserting portions 31 and 32 is, for example, a raised plate. For example, the first and second inserting portions 31 and 32 are formed integrally with the fan case 25 and made of a synthetic resin. The first and second inserting portions 31 and 32 can be elastically deformed in a direction in which they face each other, that is, in the Y1 and Y2 directions substantially orthogonal to the X direction.

A cutout 34 that avoids the heat pipe 23 is formed in a lower part of the leading end portion of each of the first and second inserting portions 31 and 32. Therefore, each of the inserting portions 31 and 32 includes a first portion 35 and a second portion 36. The first portion 35 is a base end portion connected to the fan case 25 and having a relatively large height. The height of the second portion 36 is smaller than that of the first portion 35 due to the cutout 34.

Each of the first and second inserting portions 31 and 32 includes a projection 37 (protrusion). The projection 37 protrudes in a direction (the Y1 and Y2 directions in FIG. 3) which intersects the inserting direction of the inserting portions 31 and 32 (i.e., the X direction in FIG. 3). The projection 37 protrudes in a direction substantially orthogonal to the inserting direction of the inserting portions 31 and 32, for example. Each of the first and second inserting portions 31 and 32 includes a first surface 38a and a second surface 38b. The first surface 38a is close to the discharge hole 28. The second surface 38b is opposite to the first surface 38a.

The projection 37 is provided on the second surface 38b of each of the first and second inserting portions 31 and 32 and protrudes toward the side opposite to the discharge hole 28. The projections 37 of the first and second inserting portions 31 and 32 protrude to the opposite direction each other. That is, the projections 37 of the pair of inserting portions 31 and 32 protrude in the opposite direction toward the outside of the cooling fan 21. As shown in FIG. 3, the projection 37 is tapered such that the amount of protrusion increases toward the fan case 25.

Figure 5:
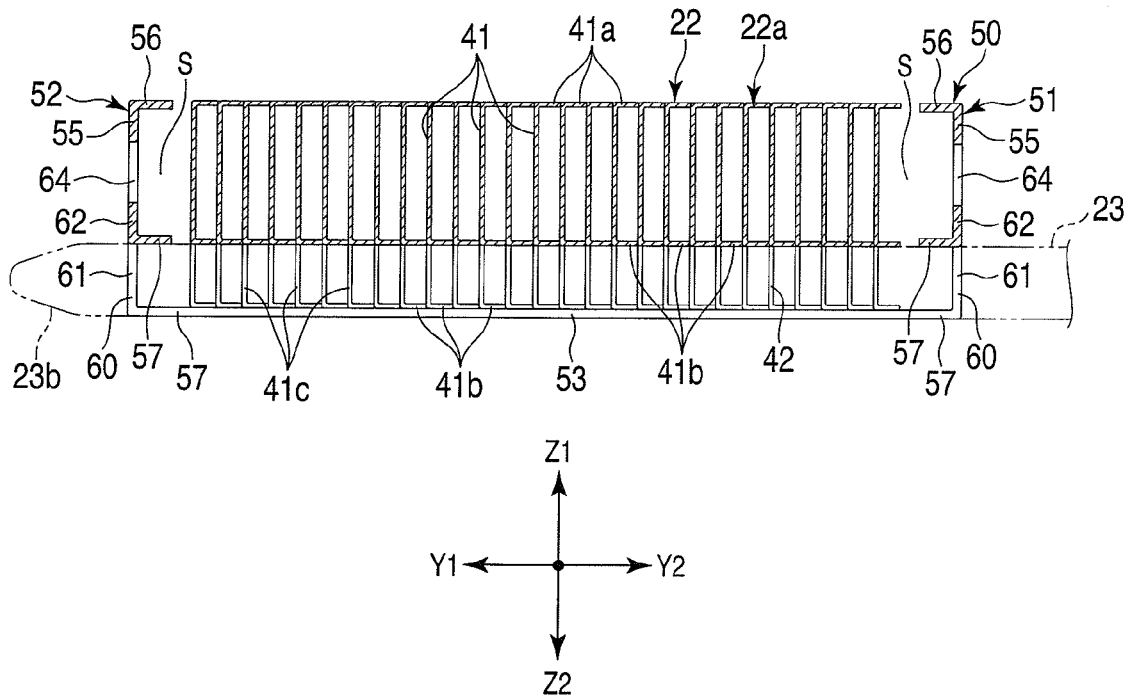
FIG. 5 is an exemplary cross-sectional view illustrating a heat sink taken along the line F5-F5 of FIG. 3.

As shown in FIG. 5, the heat sink 22 includes a plurality of fins 41. The fins 41 are arranged at predetermined intervals. The fin 41 is made of a metal material (metal sheet) with a relatively high thermal conductivity. An upper end portion 41a and a lower end portion 41b of each fin 41 are bent toward, and come into contact with, an adjacent fin 41. The bent upper end portions 41a and lower end portions 41b of the plurality of fins 41 are connected to each other to form a cover that covers the upper and lower sides of the heat sink 22.

A cutout 41c that avoids the heat pipe 23 is provided in a lower part of one end portion of each of the fins 41 opposite to the cooling fan 21. When the fins 41 are connected to each other, the cutouts 41c form a concave portion 42 through which the heat pipe 23 passes.

Figure 4:
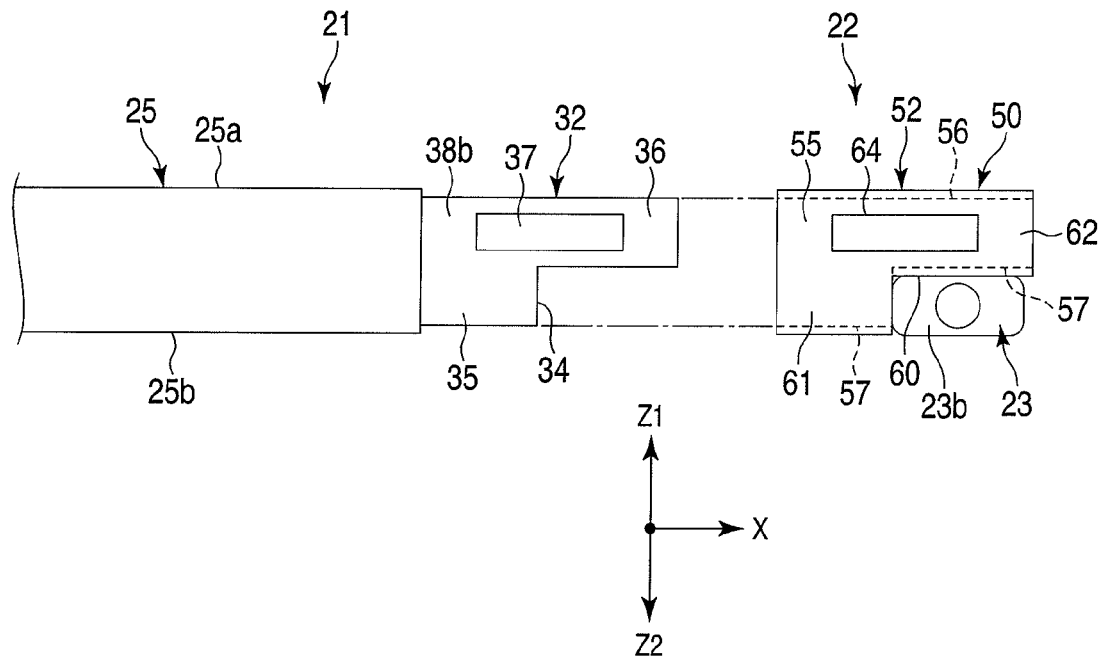
FIG. 4 is an exemplary side view illustrating the cooling device shown in FIG. 3.

As shown in FIGS. 4 and 5, the size of the concave portion 42 is equal to or larger than the outside of the heat pipe 23. In this way, the heat pipe 23 disposed in the concave portion 42 is within the thickness of the heat sink 22 (the height of the heat sink in the Z1 direction of FIG. 3). The heat pipe 23 according to this embodiment does not pass through the fins 41. The heat pipe 23 is attached to the surface (for example, the lower end portions 41b of the fins 41) of the heat sink 22. The heat pipe 23 is fixed to the surface of the heat sink 22 by, for example, soldering.

As shown in FIG. 5, a holding structure 50 that holds the first and second inserting portions 31 and 32 is provided in the heat sink 22. The holding structure 50 includes a pair of holders 51 and 52 (first and second holders 51 and 52) and a connecting portion 53 that connects the two holders 51 and 52. For example, the first and second holders 51 and 52 and the connecting portion 53 are integrally formed by one metal sheet.

The first and second holders 51 and 52 are provided on both sides of the heat sink 22 (that is, on both sides of the discharge hole 28) in the longitudinal direction. That is, the plurality of fins 41 is between the first and second holders 51 and 52. The plurality of fins 41 forms a heat sink main body 22a, which is a fin unit. The first and second inserting portions 31 and 32 are inserted into, and held by, the first and second holders 51 and 52, respectively.

The first and second holders 51 and 52 each include a holder main portion 55 and a pair of supporters 56 and 57 (first and second supporters 56 and 57). The holder main portion 55 has a plate shape and rises from the side of the heat sink 22. For example, the holder main portion 55 has substantially the same shape as each of the fins 41.

As shown in FIG. 4, a cutout 60 that avoids the heat pipe 23 is in a lower part of one end portion of the holder main portion 55 opposite to the cooling fan 21. Therefore, the holder main portion 55 includes a first portion 61 with a relatively large height and a second portion 62 having a height smaller than that of the first portion 61 due to the cutout 60.

As shown in FIG. 5, a predetermined gap S is formed between the holder main portion 55 and the fin 41 closest to the holder main portion 55 (that is, between the holder main portion 55 and the heat sink main body 22a). The first and second inserting portions 31 and 32 are inserted into the gaps S and come into contact with the first and second holders 51 and 52 toward the outside of the cooling device 17.

Each of the holder main portions 55 includes an opening portion 64. The opening portion 64 is formed in the holder main portion 55 in the protruding direction of the projection 37 (in the Y1 and Y2 directions in FIGS. 3 and 5). When the inserting portions 31 and 32 are inserted into the holders 51 and 52, the projections 37 are engaged with the opening portions 64. As shown in FIGS. 4 and 5, the opening portion 64 has substantially the same outward shape as the projection 37, and the projection 37 is fitted to the opening portion 64.

The first and second holders 51 and 52 are at positions slightly closer to the center of the heat sink 22 than the second surface 38b of the first and second inserting portions 31 and 32 in the Y1 and Y2 directions. Therefore, the first and second inserting portions 31 and 32 inserted into the first and second holders 51 and 52 are slightly elastically deformed and flexed to the center of the heat sink 22 (that is, in the Y1 and Y2 directions). The first and second inserting portions 31 and 32 apply a pressing force to the holder main portions 55 as a reactive force to the elastic deformation in the protruding direction of the projections 37 (that is, in the Y1 and Y2 directions). In this way, the position of the cooling fan 21 relative to the heat sink 22 in the Y1 and Y2 directions is determined.

Figure 6:
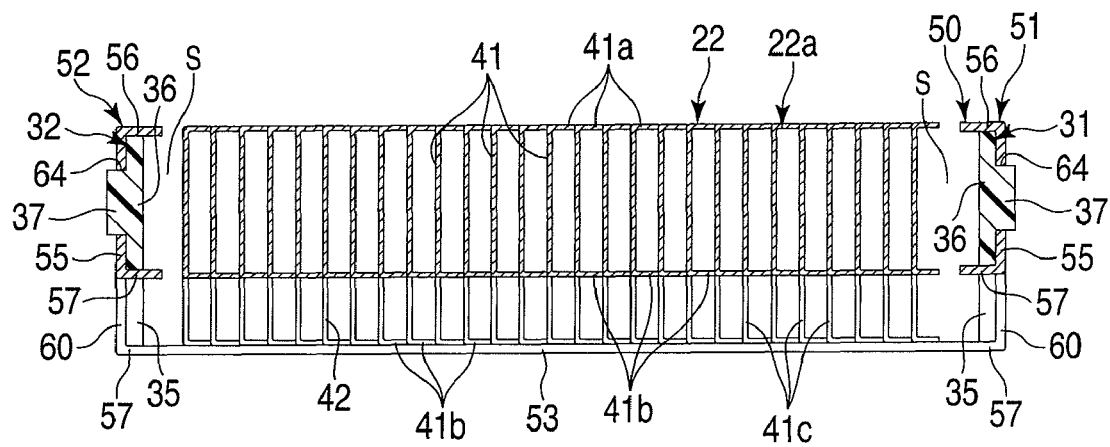
FIG. 6 is an exemplary cross-sectional view illustrating the cooling fan coupled to the heat sink shown in FIG. 5.
Figure 7:
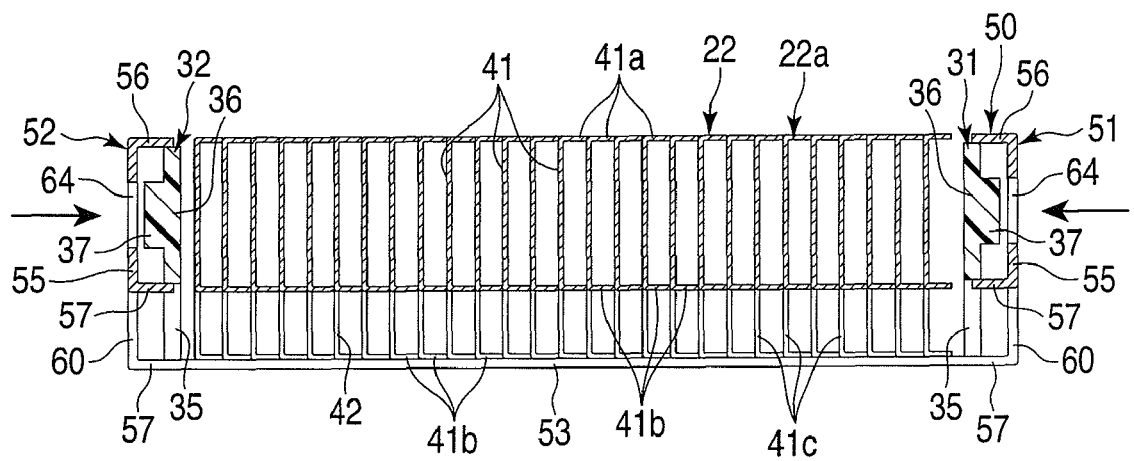
FIG. 7 is an exemplary cross-sectional view illustrating the deformed state of inserting portions of the cooling fan shown in FIG. 6.

As shown in FIGS. 6 and 7, when the inserting portions 31 and 32 are removed from the holders 51 and 52, the inserting portions 31 and 32 can be flexed in the gaps S between the holder main portions 55 and the heat sink main body 22a. That is, the gaps S between the holder main portions 55 and the heat sink main body 22a are relatively large such that the inserting portions 31 and 32 can be flexed in the Y1 and Y2 directions until the projections 37 are taken off from the opening portions 64.

As shown in FIG. 6, the first and second supporters 56 and 57 are integrated with the holder main portion 55 and are formed by bending the end portions of the holder main portion 55. For example, the first supporter 56 is bent from the upper end portion of each holder main portion 55 and faces the inserting portion 31 or 32 from above. For example, the second supporter 57 is bent from the lower end portion of each holder main portion 55 and faces the inserting portion 31 or 32 from below.

That is, the first and second supporters 56 and 57 face the inserting portions 31 and 32 in a direction (for example, a substantially orthogonal direction: the Z1 and Z2 directions in FIG. 3) which intersects the inserting direction of the inserting portions 31 and 32 and the protruding direction of the projections 37. The first and second supporters 56 and 57 are opposite to each other with the inserting portions 31 and 32 interposed therebetween. The first and second supporters 56 and 57 come into contact with the inserting portions 31 and 32. That is, each of the inserting portions 31 and 32 is interposed between the first and second supporters 56 and 57. In this way, the position of the cooling fan 21 relative to the heat sink 22 in the vertical direction is determined.

The first and second supporters 56 and 57 may face the inserting portions 31 and 32 in a direction that obliquely intersects the inserting direction of the inserting portions 31 and 32 and the protruding direction of the projections 37. The second supporter 57 may not necessarily face the inserting portion 31 or 32 in the opposite direction of the first supporter 56, but may face the inserting portion 31 in other directions.

As shown in FIG. 4, the first and second supporters 56 and 57 are over the entire width of the holder main portion 55 in the inserting direction of the inserting portions 31 and 32. That is, the second supporter 57 is in the first and second portions 61 and 62 of the holder main portion 55.

As shown in FIG. 5, the first supporter 56 is bent at substantially the same height as the end portion (for example, the upper end portion 41a) of the fin 41. That is, the upper end portion of the first supporter 56 is substantially flush with the upper end portion of the fin 41. That is, the holding structure 50 does not protrude from the heat sink 22 to the upper side.

As shown in FIG. 5, the connecting portion 53 is a plate member and overlaps the heat sink 22. The connecting portion 53 faces one side (for example, the lower side) of the heat sink 22 over the entire length of the heat sink 22 in the longitudinal direction. The connecting portion 53 connects the first and second holders 51 and 52 on both sides of the heat sink 22. The connecting portion 53 connects the end portions (for example, the lower end portions) of the first and second holders 51 and 52. The connecting portion 53 is fixed to the heat sink 22 (that is, a plurality of fins 41) by, for example, soldering.

Instead of the above-mentioned structure, a connecting portion 53 may be provided which faces the heat sink 22 from the upper side and connects the upper end portions of the first and second holders 51 and 52. In this case, the second supporter 57 may be bent at substantially the same height as the end portion (for example, the lower end portion 41b) of the fin 41. That is, the lower end portion of the second supporter 57 may be substantially flush with the lower end portion of the fin 41.

The heat pipe 23 includes a first end portion 23a, which is a heat receiving end portion, and a second end portion 23b, which is a heat radiation end portion. The first end portion 23a is thermally connected to the heating component 16. As shown in FIG. 2, the second end portion 23b communicates with the concave portion 42 of the heat sink 22. The heat pipe 23 is fixed and thermally connected to the heat sink 22. In this way, the heat sink 22 is thermally connected to the heating component 16.

Next, the operation of the cooling device 17 will be described.

In the cooling device 17 according to this embodiment, no screw is used to fix the cooling fan 21 to the heat sink 22. The cooling fan 21 is fixed to the heat sink 22 by inserting the inserting portions 31 and 32 of the cooling fan 21 into the holders 51 and 52 of the heat sink 22.

That is, when the inserting portions 31 and 32 are inserted into the holders 51 and 52, the projections 37 are engaged with the opening portions 64 and the pair of inserting portions 31 and 32 elastically deformed during the insertion is pressed against the holder main portions 55. In this way, the cooling fan 21 is positioned relative to the heat sink 22 in the protruding direction of the projections 37 (the Y1 and Y2 directions).

The inserting portions 31 and 32 are supported by the first and second supporters 56 and 57 in the vertical direction, and the cooling fan 21 is positioned relative to the heat sink 22 in the vertical direction. In addition, the rattling of the cooling fan 21 with respect to the heat sink 22 is suppressed.

As shown in FIG. 7, the cooling fan 21 is removed from the heat sink 22 by pressing the projections 37 of the inserting portions 31 and 32 to the inside of the cooling device 17 to elastically deform the inserting portions 31 and 32, thereby taking off the projections 37 from the opening portions 64, and drawing out the inserting portions 31 and 32 from the holders 51 and 52. In this way, the cooling fan 21 is removed from the heat sink 22.

According to this structure, it is possible to reduce the number of parts. That is, a general cooling fan is fixed to a bracket of the heat sink by screws. In this structure requiring screws, the screwing operation becomes a burden and the number of parts increases, which results in an increase in manufacturing costs.

In contrast, according to the structure of this embodiment, the inserting portions 31 and 32 are inserted into the holders 51 and 52 and the projections 37 are fitted to the opening portions 64. Therefore, it is possible to fix the cooling fan 21 and the heat sink 22 without using screws. In this way, it is possible to reduce the load of the screwing operation and reduce the number of necessary screws. As a result, it is possible to reduce the number of parts.

In addition, according to the above-mentioned structure, it is possible to fix the cooling fan 21 and the heat sink 22 with a simple operation of only inserting the inserting portions 31 and 32 into the holders 51 and 52. As a result, it is possible to significantly improve assemblability.

In this embodiment, the size of the opening portion 64 is substantially equal to that of the projection 37. However, when the opening portion 64 is designed such that the size thereof is completely equal to that of the projection 37, the projection 37 may not be fitted to the opening portion 64 due to a dimensional tolerance in manufacture. Therefore, the size of the opening portion 64 needs to be larger than that of the projection 37 in order to absorb the dimensional tolerance. Therefore, there is a little gap (play) between the opening portion 64 and the projection 37. The gap is likely to cause the rattling of the cooling fan 21 with respect to the heat sink 22 even when the projections 37 are engaged with the opening portions 64.

On the other hand, according to the structure of this embodiment, the first and second supporters 56 and 57 are provided so as to face the inserting portions 31 and 32 in the direction substantially orthogonal to the inserting direction of the inserting portions 31 and 32 and the protruding direction of the projections 37. Since each of the inserting portions 31 and 32 is interposed between the first and second supporters 56 and 57, it is possible to suppress the rattling of the cooling fan 21 with respect to the heat sink 22.

The pair of inserting portions 31 and 32 and the pair of holders 51 and 52 are on both sides of the discharge hole 28 to form a connecting structure that connects the heat sink 22 to the cooling fan 21 on both sides of the heat sink 22 in the longitudinal direction. Therefore, the holding stability of the cooling fan 21 is improved.

When the first and second supporters 56 and 57 are formed integrally with the holder main portion 55 and are bent from the end portions of the holder main portion 55, it is possible to form the holder main portion 55 and the first and second supporters 56 and 57 with one metal sheet. As a result, it is possible to further reduce the number of parts.

The first and second holders 51 and 52 may be independently formed each other and fixed to the heat sink 22. However, since the holder main portions 55 are pressed to the outside of the cooling device 17 by the elastic force of the inserting portions 31 and 32 elastically deformed during insertion, the first and second holders 51 and 52 are likely to be taken off from the heat sink 22. However, as in this embodiment, when the connecting portion 53 connecting the ends of the first and second holders 51 and 52 is provided, the first and second holders 51 and 52 are suppressed from being taken off from the heat sink 22.

The connecting portion 53 is not on both sides of the heat sink 22 in the vertical direction, but is only on the upper side or the lower side of heat sink 22. Therefore, it is possible to suppress an increase in the thickness of the heat sink 22. When the first supporter 56 (or the second supporter 57) is bent at substantially the same height as the end of the fin 41, it is possible to further suppress an increase in the thickness of the heat sink 22.

When the gaps S, in which the inserting portions 31 and 32 can be elastically deformed such that the projections 37 can be taken off from the opening portions 64, are formed between the holders 51 and 52 and the fins 41, it is possible to smoothly remove the cooling fan 21 from the heat sink 22 by elastically deforming the inserting portions 31 and 32. In this way, the maintenance of the cooling device 17 is improved.

When the heat pipe 23 is attached to the surface of the heat sink 22, it is possible to improve flexibility in the shapes of the holder main portion 55 and the first and second supporters 56 and 57, as compared to the structure in which the heat pipe 23 penetrates through the fins 41. In this way, it is possible to realize the holding structure 50 with a simple shape.

Second Embodiment

Next, an electronic apparatus 1 and a cooling device 17 according to a second embodiment will be described with reference to FIG. 8. In the second embodiment, components having the same or similar functions as those in the first embodiment are denoted by the same reference numerals and a description thereof will be omitted. The second embodiment is similar to the first embodiment except for the following structure.

As shown in FIG. 8, the inserting portions 31 and 32 according to this embodiment are provided on the heat sink 22. A pair of first and second inserting portions 31 and 32 is provided on both sides of the heat sink 22. The holders 51 and 52 are provided on the cooling fan 21. A pair of first and second holders 51 and 52 is provided on both sides of the discharge hole 28. For example, the holders 51 and 52 are formed integrally with the fan case 25 and made of a synthetic resin.

According to this structure, it is possible to reduce the number of parts, similar to the first embodiment.

Third Embodiment

Next, an electronic apparatus 1 and a cooling device 17 according to a third embodiment will be described with reference to FIGS. 9 and 10. In the third embodiment, components having the same or similar functions as those in the first embodiment are denoted by the same reference numerals and a description thereof will be omitted. The second embodiment is similar to the first embodiment except for the following structure.

Figure 9:
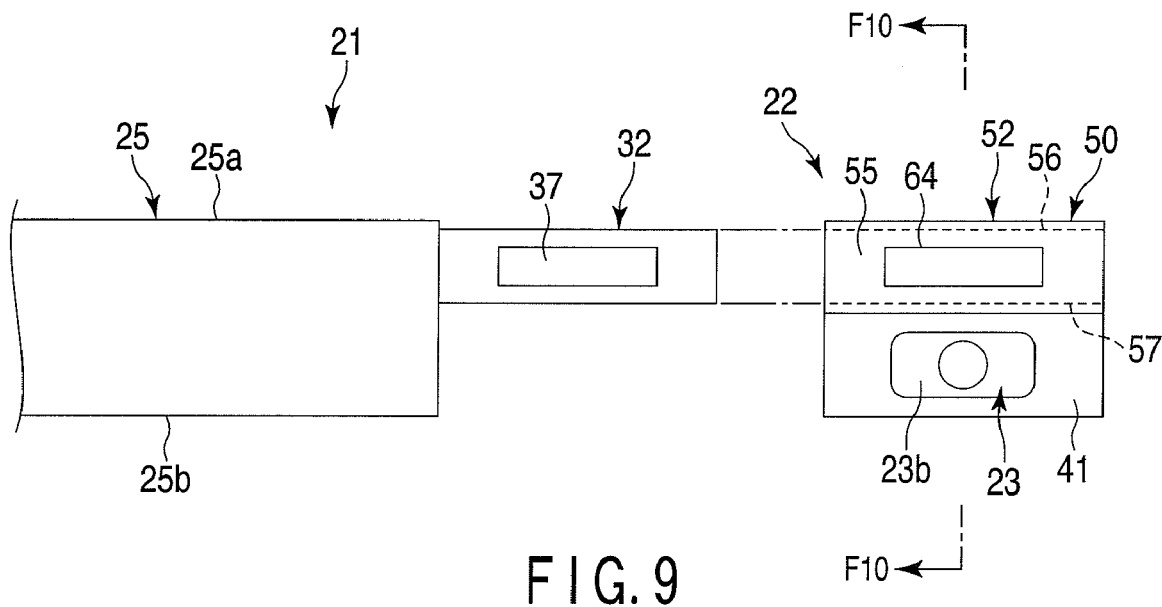
FIG. 9 is an exemplary perspective view illustrating a cooling device according to a third embodiment.
Figure 10:
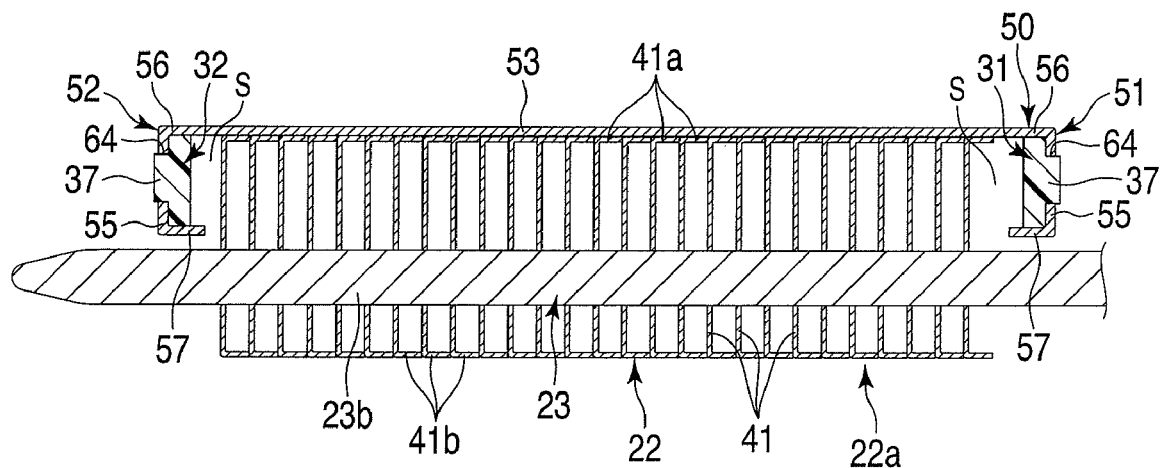
FIG. 10 is an exemplary cross-sectional view illustrating the cooling device taken along the line F10-F10 of FIG. 9.

As shown in FIGS. 9 and 10, the heat pipe 23 according to this embodiment penetrates through the heat sink 22. The heat pipe 23 deviates from the center of the fin 41 in the vertical direction. In this embodiment, the heat pipe 23 leans toward the lower side from the center of the fin 41. The heat pipe 23 may lean toward the upper side from the center of the fin 41.

Each of the holders 51 and 52 is only in a region corresponding to an upper part of the fin 41 so as to avoid the heat pipe 23. Each of the holders 51 and 52 is provided on one side of the fin 41 opposite to the heat pipe 23 in the vertical direction.

According to this structure, it is possible to reduce the number of parts, similar to the first embodiment.

Fourth Embodiment

Next, an electronic apparatus 1 and a cooling device 17 according to a fourth embodiment will be described with reference to FIGS. 11 and 12. In the fourth embodiment, components having the same or similar functions as those in the first embodiment are denoted by the same reference numerals and a description thereof will be omitted. The second embodiment is similar to the first embodiment except for the following structure.

Figure 11:
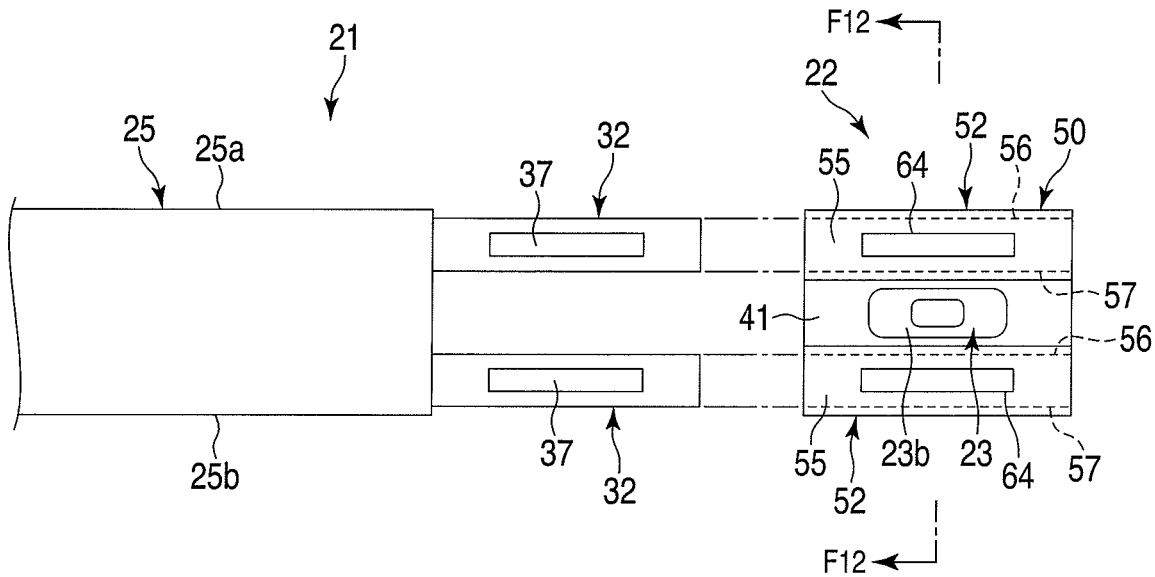
FIG. 11 is an exemplary side view illustrating a cooling device according to a fourth embodiment.
Figure 12:
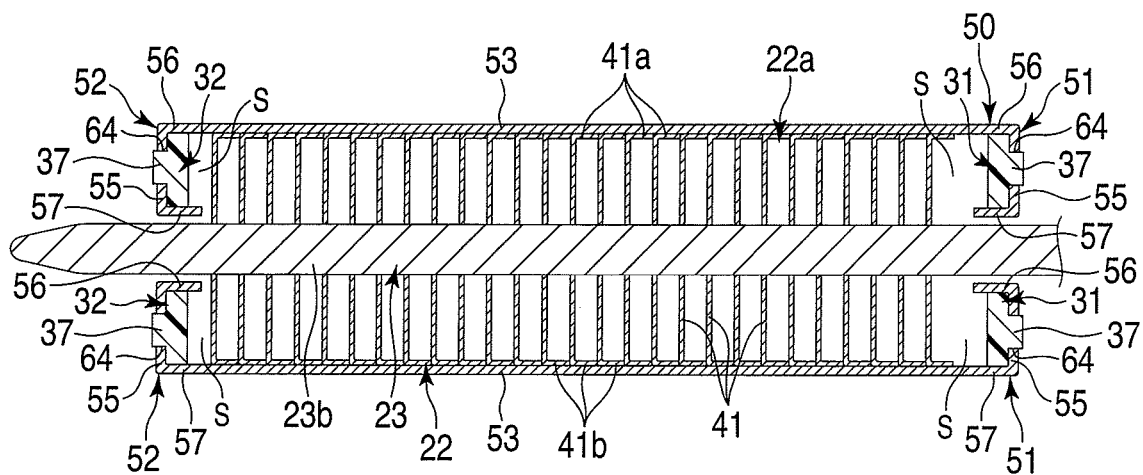
FIG. 12 is an exemplary cross-sectional view illustrating the cooling device taken along the line F12-F12 of FIG. 11.

As shown in FIG. 11 and FIG. 12, the heat pipe 23 according to this embodiment penetrates through the heat sink 22. The heat pipe 23 penetrates through, for example, the substantial center of the fin 41. Two first holders 51 and two second holders 52 are provided on the upper and lower sides of the heat pipe 23 so as to avoid the heat pipe 23.

According to this structure, it is possible to reduce the number of parts, similar to the first embodiment.

The electronic apparatuses 1 and the cooling devices 17 according to the first to fourth embodiments have been described above, but the embodiments are not limited thereto. The components according to the first to fourth embodiments may be appropriately combined with each other. The invention is not limited to the above-described embodiments, but various modifications and changes of the invention can be made without departing from the scope and spirit of the invention.

For example, the structures of the cooling devices according to the above-described embodiments may be reversed in the vertical direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cooling device comprising:
    a cooling fan;
    a heat sink;
    an inserting portion on either the cooling fan or the heat sink;
    a projection on the inserting portion, the projection protruding in a direction intersecting an inserting direction of the inserting portion; and
    a holder on either the cooling fan or the heat sink which does not comprise the inserting portion, and configured to receive the inserting portion, the holder comprising:
    an opening portion configured to engage with the projection;
    a first supporter facing the inserting portion in a first direction intersecting the inserting direction of the inserting portion and a protruding direction of the projection; and
    a second supporter facing the inserting portion in a second direction different from the first direction.

2. The cooling device of claim 1,
    wherein the cooling fan comprises an outlet, and
    the inserting portion and the holder are provided on each of both sides of the outlet.

3. The cooling device of claim 2,
    wherein the projection of the inserting portion protrudes toward a side opposite to the outlet.

4. The cooling device of claim 3,
    wherein the holder comprises a holder main portion comprising the opening portion, and
    the first supporter and the second supporter are with the holder main portion as a unit and bent from end portions of the holder main portion.

5. The cooling device of claim 4,
    wherein the inserting portion is on the cooling fan, and the holder is on the heat sink.

6. The cooling device of claim 5, further comprising a connecting portion connecting an end portion of the holder on one of the sides of the outlet with an end portion of the holder on the other side of the outlet,
    wherein the heat sink comprises a plurality of fins between the holder on the one of sides of the outlet and the holder on the other side of the outlet, and the connecting portion faces a first end of each fin.

7. The cooling device of claim 6,
    wherein the end portion of the fin is bent toward an adjacent fin, and the first supporter is bent at substantially the same height as the end portion of the fin.

8. The cooling device of claim 6,
    wherein a gap is between the holder and the fin, the inserting portion being flexure in the gap which allows the projection to be out of the opening portion.

9. The cooling device of claim 1, further comprising a heat pipe attached to a surface of the heat sink.

10. An electronic apparatus comprising:
    a housing;
    a heating component in the housing;
    a cooling fan;
    a heat sink thermally connected to the heating component;
    an inserting portion on either the cooling fan or the heat sink;
    a projection on the inserting portion, the projection protruding in a direction intersecting an inserting direction of the inserting portion; and
    a holder on either the cooling fan or the heat sink which does not comprise the insertion portion, and configured to receive the inserting portion, the holder comprising:
    an opening portion configured to engage with the projection;
    a first supporter facing the inserting portion in a first direction intersecting the inserting direction of the inserting portion and a protruding direction of the projection; and
    a second supporter facing the inserting portion in a second direction different from the first direction.

* * * * *